United States Patent [19]

Fiorina et al.

[11] Patent Number: 5,381,350
[45] Date of Patent: Jan. 10, 1995

[54] PROCESS FOR DETERMINING THE BACKUP TIME OF A BATTERY

[75] Inventors: Jean-Noël Fiorina, Seyssinet-Pariset; Patrick Lailler, Clichy, both of France

[73] Assignee: Merlin Gerin, France

[21] Appl. No.: 91,915

[22] Filed: Jul. 16, 1993

[30] Foreign Application Priority Data

Aug. 5, 1992 [FR] France .................................. 92 09818

[51] Int. Cl.6 ............................................ G06F 15/20
[52] U.S. Cl. .................... 364/550; 324/427;
340/636; 364/480; 364/481
[58] Field of Search ................... 324/427; 340/636;
364/481, 483, 550

[56] References Cited

U.S. PATENT DOCUMENTS

| | | | |
|---|---|---|---|
| 3,411,091 | 11/1968 | Umeda | 340/636 X |
| 4,333,149 | 6/1982 | Taylor et al. | 364/481 |
| 4,677,363 | 6/1987 | Kopmann | 320/44 |
| 4,743,831 | 5/1988 | Young | 340/636 X |
| 4,803,416 | 2/1989 | Abiven et al. | 320/44 |
| 4,876,513 | 10/1989 | Brilmyer et al. | 340/636 X |
| 4,952,862 | 8/1990 | Baigetti et al. | 324/427 |
| 5,124,627 | 6/1992 | Okada | 340/636 X |
| 5,193,067 | 3/1993 | Sato et al. | 364/483 |

OTHER PUBLICATIONS

Shinji Ishizuki et al., "Equipment for the Calculation of Battery Remaining Discharge Time in Telecommunications System", Jul. 1991.

*Primary Examiner*—Edward R. Cosimano
*Attorney, Agent, or Firm*—Parkhurst, Wendel & Rossi

[57] ABSTRACT

The backup time of the battery is obtained by estimation, in iterative manner, of discharging of the battery during successive estimated time intervals. During each of the estimated time intervals, an estimated discharging current in terms of the actual discharge power, an estimated voltage, and an estimated state of charge are computed in accordance with a mathematical model equivalent to the battery. The backup time of the battery is equal to the sum of the estimated time intervals necessary for the estimated voltage to reach a preset threshold. The process enables ageing of the battery to be taken into account and an alarm to be provided when the lifetime of the battery becomes too short.

10 Claims, 8 Drawing Sheets

PROCESS FOR DETERMINING THE BACKUP TIME OF A BATTERY

BACKGROUND OF THE INVENTION

The invention relates to a process for determining the backup time of a battery, comprising measuring of the voltage at terminals of the battery, of the charging or discharging current of the battery, computation, from the measured voltage and current values, of the discharge power of the battery and determination of the backup time of the battery in terms of the power.

It is state-of-the-art to determine the backup time of a battery bank, notably a battery bank of an Uninterruptible Power Supply, taking into account the current delivered by the battery, the voltage measured at its terminals, and battery discharge curves obtained experimentally or provided by the battery manufacturer.

In state-of-the-art microprocessor-based systems, the battery discharge curves are recorded, for example in the form of tables, in a memory associated with the microprocessor.

The discharge curves are different for each type of battery and are not always provided in the same form by the suppliers. The curves corresponding to the battery used have to be stored in the device for determining the backup time. This storing requires a large memory capacity. In addition it makes it difficult to take into account ageing of the battery, its actual state of charge and the charge variations in the course of discharging.

The object of the invention is to overcome these shortcomings.

SUMMARY OF THE INVENTION

According to the invention, determining the backup time involves estimation, in iterative manner, of discharging of the battery during successive estimated time intervals, said estimation comprising, for each estimated time interval, computation of a estimated voltage at the terminals of the battery taking account of the power and of predetermined parameters characteristic of the battery, comparison of the estimated voltage with a minimum discharging voltage of the battery, and summing of the successive estimated time intervals, the backup time of the battery being equal to the sum of the time intervals obtained when the estimated voltage reaches the minimum discharging voltage.

According to a particular embodiment, computation of the estimated voltage comprises computation of a estimated discharging current and computation of a estimated state of charge of the battery. Computation of the estimated discharging current is performed in accordance with the equation:

$$i = (Eo - \sqrt{Eo^2 - 4RP})/2R$$

in which Eo is an equivalent voltage characteristic of the battery, R the internal resistance of the battery and P the discharge power of the battery.

Computation of the estimated state of charge is preferably performed at each estimated time interval by subtracting from the previous estimated state of charge the ratio between the product of the estimated current and of the time interval and a parameter characteristic of the battery, representative of its capacity. The internal resistance of the battery is computed during each estimated time interval, from a parameter characteristic of the battery, representative of its internal resistance when it is fully charged, and from the state of charge of the battery.

The process can, in addition, comprise computation of the actual state of charge of the battery, said actual state of charge being used as the initial estimated state of charge when discharging of the battery is estimated.

It can also comprise updating of the parameters characteristic of the battery, representative of its internal resistance in the fully charged state and of its capacity, to take ageing of the battery into account.

According to a preferred embodiment, updating of the internal resistance of the battery in the fully charged state comprises a predetermined progressive increase of said internal resistance. Updating of the capacity of the battery comprises computation of a new value of the capacity equal to the ratio between an updated value of the internal resistance of the battery in the fully charged state and a coefficient obtained by making the product of the initial values of the two parameters involved.

The process can also comprise determination of the remaining lifetime of the battery from determination of its backup time.

BRIEF DESCRIPTION OF THE DRAWINGS

Other advantages and features will become more clearly apparent from the following description of an embodiment of the invention illustrated in the accompanying drawings, in which.

DESCRIPTION OF THE PREFERRED EMBODIMENT

Figure 1:
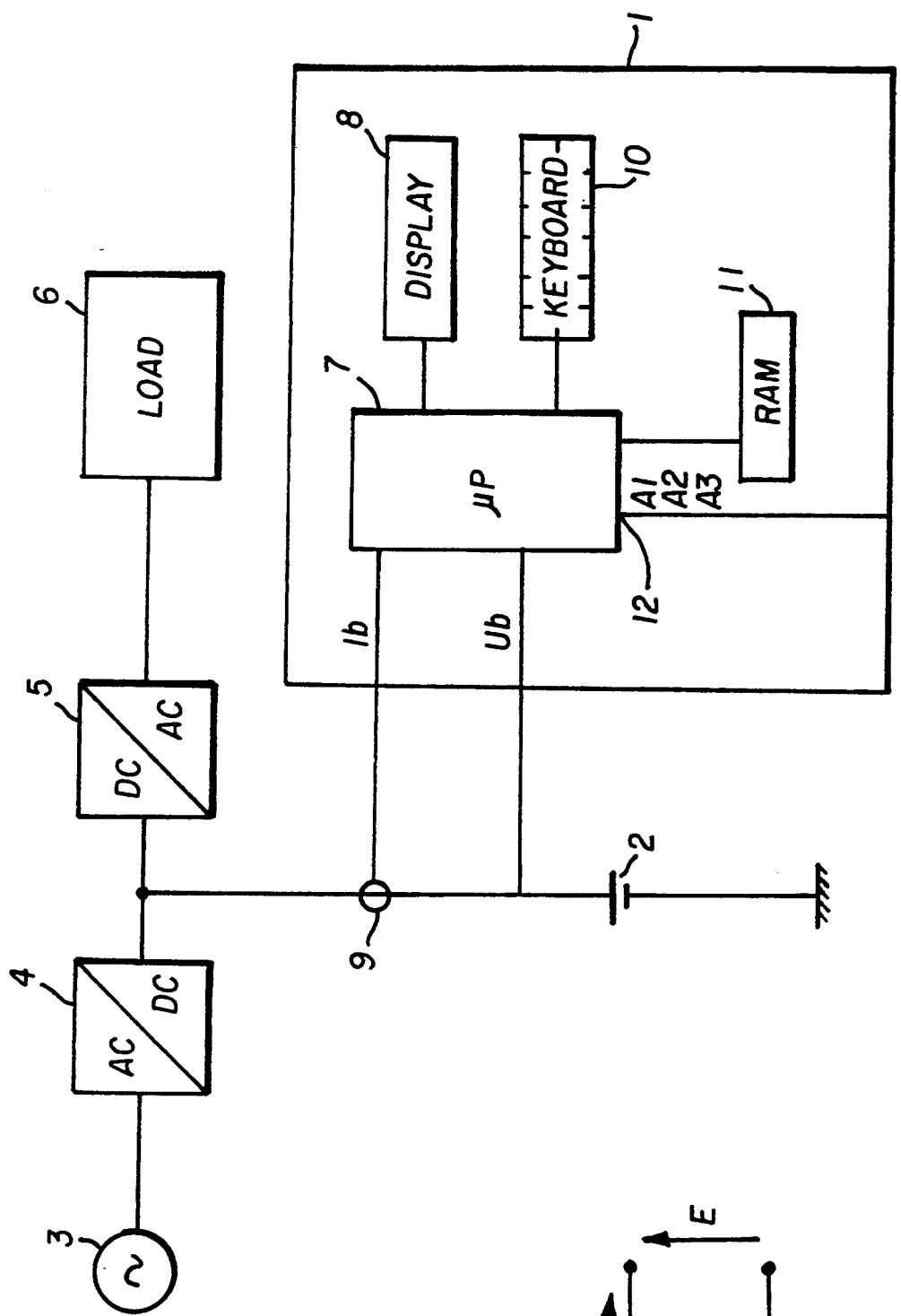
FIG. 1 illustrates schematically a device implementing the process according to the invention for determining the backup time of a battery of a UPS.

FIG. 1 illustrates the application of a device 1 for determining the backup time of a battery to a battery 2 of a UPS. The UPS, of conventional type, represented schematically in the figure, is supplied by an AC voltage source 3 and comprises an AC-DC converter 4 serially connected with a DC-AC converter, or inverter 5, and a load 6, the battery 2 being connected to the output of the converter 4.

The device 1 comprises an electronic processing circuit 7, with microprocessor, connected to a display device 8. The electronic processing circuit 7 receives on input signals representative of the charging or discharging current Ib of the battery, supplied by a current sensor 9, and signals representative of the voltage Ub at the terminals of the battery.

The circuit 7 also comprises means for entering parameters. The means for entering are, in the figure, represented in the form of a keyboard 10, but can naturally take any other equivalent form. The microprocessor is, in conventional manner, connected to storage means 11, RAM and registers, enabling the parameters, measured values (Ib, Ub) and different computed values to be stored.

Figure 2:
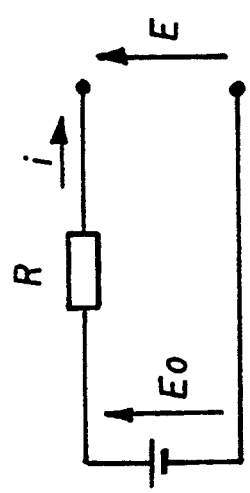
FIG. 2 represents an equivalent circuit of the battery.

The battery is considered as being equivalent to the circuit represented in FIG. 2 and comprising in series a constant DC voltage source Eo and an internal resistance R. If i is the current supplied by the battery and E the voltage at the terminals of the battery, the equation:

$$E = Eo - Ri \quad (1)$$

is verified.

The internal resistance of the battery can be expressed in the form:

$$R = Ro/S^k \quad (2)$$

where R is the internal resistance of the battery when it is fully charged, i.e. when its state of charge $S = 1$, and where k is a coefficient proper to the battery.

The state of charge of the battery can be expressed in the form:

$$S = 1 - \int i \, dt / C \quad (3)$$

where C is the capacity of the battery, expressed in Axh. $P = Ei$ being the power supplied by the battery, the current i can then be expressed in the form:

$$i = (Eo - \sqrt{Eo^2 - 4RP}) / 2R \quad (4)$$

This mathematical model is used to determine the backup time of the battery.

Figure 3:
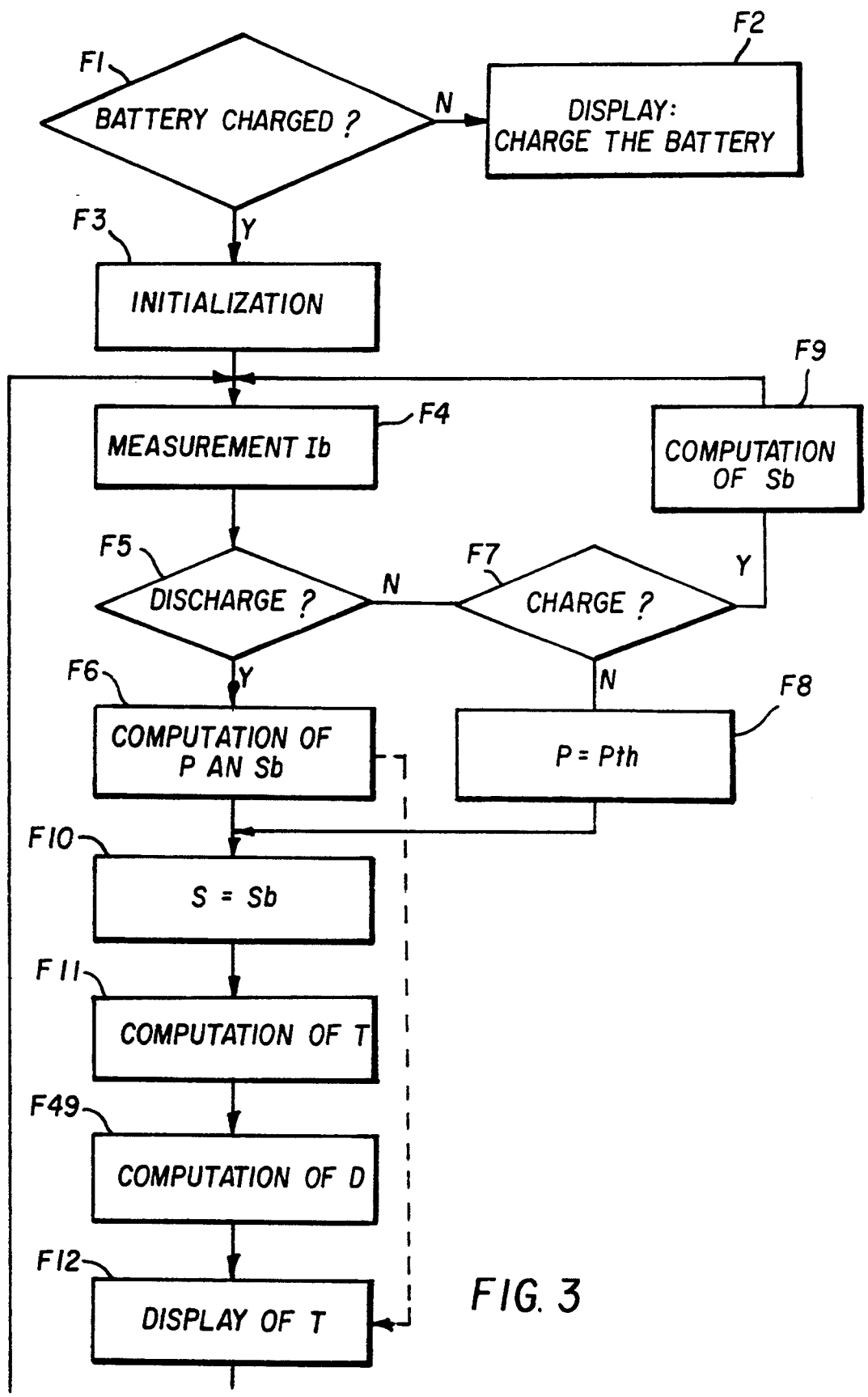
FIG. 3 represents a general flow chart representative of operation of the device according to FIG. 1.

The microprocessor of the processing circuit 7 successively performs the various phases of the general flow chart represented in FIG. 3.

When the device is first switched on to determine the backup time of a battery 2, the microprocessor checks (F1) that the battery is charged. This information can be supplied to the device by any suitable means, for example by means of a logic signal A1 applied to an input 12 (FIG. 1) of the processing circuit and supplied by an external monitoring device (not represented) or by actuation of a switch provided on the device 1, for example after a minimum charging time (12h for example). If the battery is not charged (A1=0), the microprocessor displays the corresponding information on the display device 8, for example: "Charge the battery" (F2).

When the battery is charged (A1=1), the microprocessor goes on to an initialization phase (F3) which will be described in greater detail further on with reference to FIG. 7.

After the initialization phase, determining the backup time T of the battery is performed at regular intervals (ΔT1), for example every second. This determining begins by a read (F4) by the microprocessor of the current Ib, supplied by the current sensor 9. Then the microprocessor checks (F5) whether a discharging current is involved (F5). This information can be supplied to the device by any suitable means, for example by means of a second logic signal A2 applied to the input 12 of the processing circuit or by determining the sign of the current Ib.

If the battery is in a discharging cycle (A2=1), the microprocessor then computes (F6) the power P supplied by the battery and its actual state of charge Sb. This computing phase will be described in greater detail further on with reference to FIG. 5.

If the battery is not discharging (A2=0), the microprocessor checks (F7) whether it is in a charging period or if it is not called on. This information can be supplied by a third logic signal A3 applied to the input 12, at 1 if charging and at 0 if not or by comparison of the current measured with 0, Ib being nil if the battery is not called on.

If the battery is not called on (output N of F7), the microprocessor takes (F8) as value of the power P a theoretical power Pth, chosen arbitrarily, previously stored in the storage means 11. This theoretical power may correspond for example to the full power of the power supply containing the battery, to half of this power or to the actual power delivered by the power supply.

Figure 6:
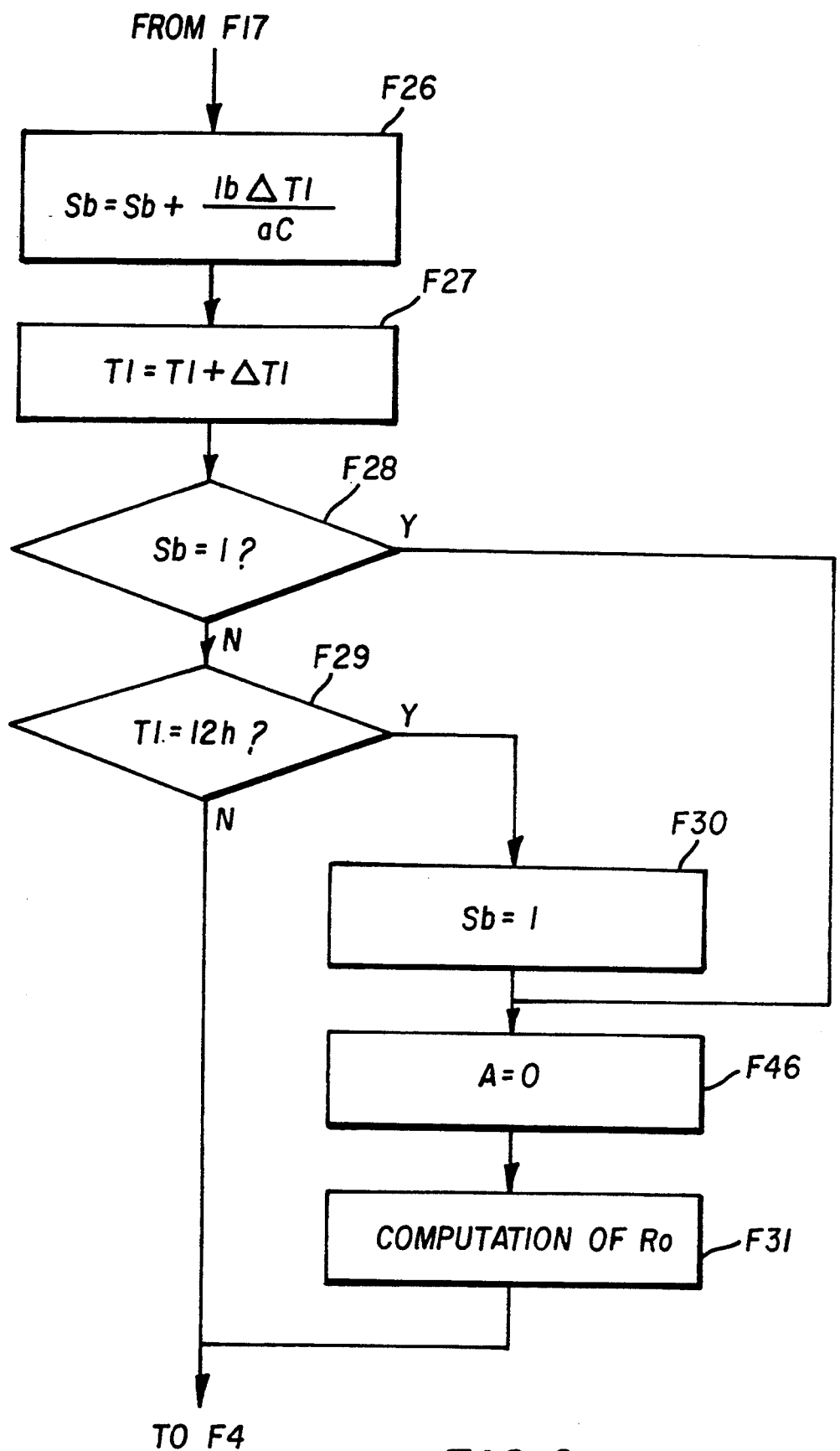
FIG. 6 represents in greater detail an updating phase of the state of charge of the battery when the latter is charging.

In FIG. 3, during charging of the battery (output Y of F7), the backup time is not computed, but the microprocessor can (F9) update the actual state of charge Sb of the battery, in the manner described in greater detail further on with reference to FIG. 6, before looping back to the input of F4 for a new backup time determining cycle. According to an alternative embodiment, not represented, the microprocessor can compute the backup time during charging in the same way as when the battery is not called on, by taking into account the actual state of charge of the battery computed at F9.

After the phases F6 or F8, the microprocessor takes (F10) as state of charge S the actual state of charge Sb of the battery, then proceeds (F11) with computation of the backup time T. This computation phase of T will be described in greater detail further on with reference to FIG. 4. The microprocessor then checks (F12) display of the backup time T, on the display device 8, before looping back to the input of F4 for a new backup time determining cycle.

Figure 4:
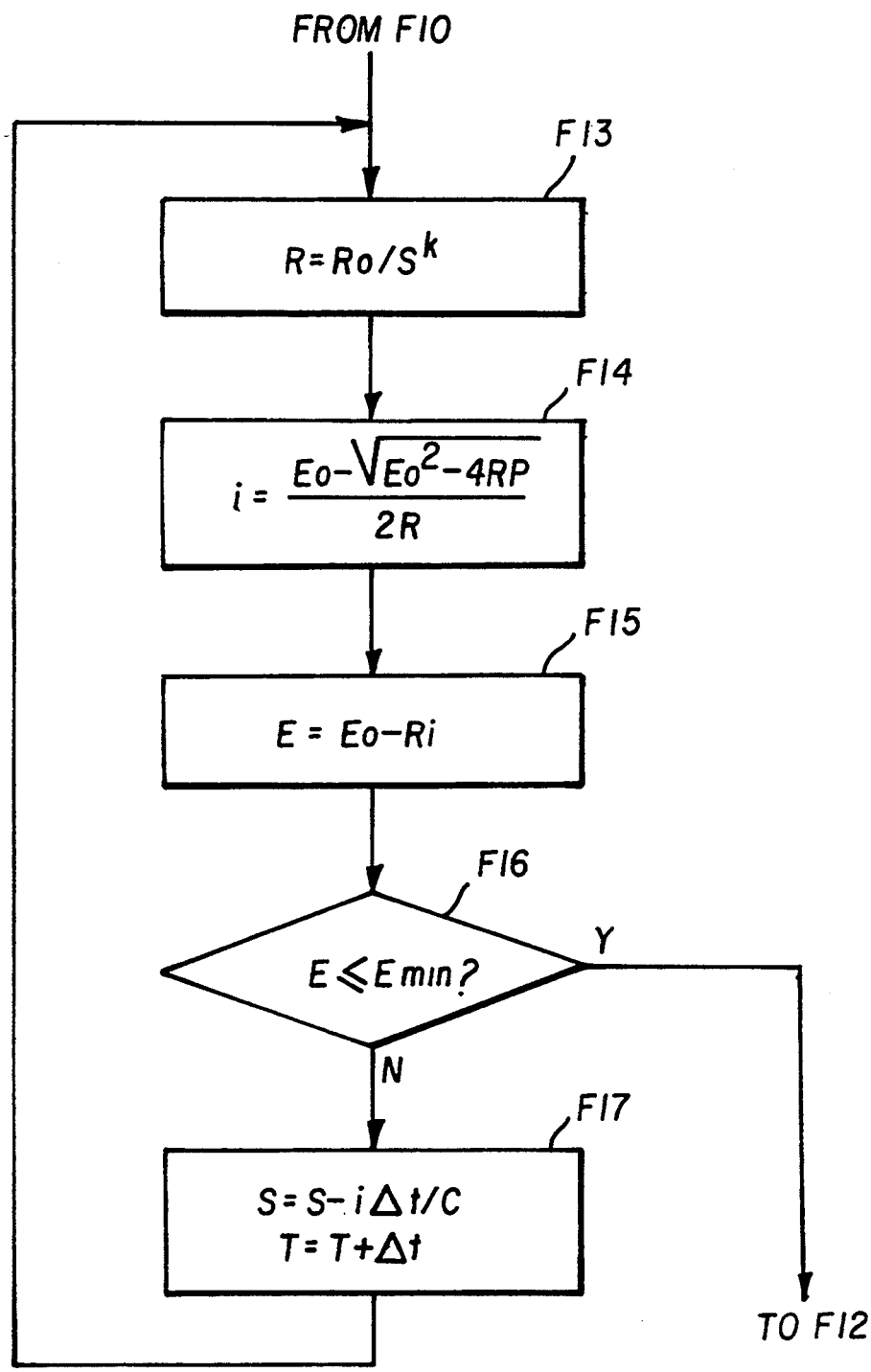
FIG. 4 represents in greater detail an embodiment of the computation phase of the backup time of the flow chart according to FIG. 3.

The phase F11 of computation of T is represented in FIG. 4. This phase begins by a computation phase 13 of the internal resistance R of the battery in accordance with the equation (2). The values Ro and k, characteristic of the battery and obtained from the data provided by the manufacturer, have been stored in the memory 11, whereas the state of charge S was determined during the phase F10. The phase F13 is followed by a phase F14 computing the estimated current i supplied by the battery, in accordance with the equation (4), from the values of R and P previously computed respectively during the phases F13 and F6 or F8 and from the value Eo, characteristic of the battery and stored in the memory 11.

The phase F14 is followed by a phase F15 computing the simulated voltage E at the terminals of the battery, in accordance with the equation (1). Then (F16) the estimated voltage is compared with a predetermined value Emin, corresponding to the predetermined minimum value of the discharging voltage of the battery.

If E is greater than Emin (output N of F16), the next phase F17 consists in computing the new state of charge S after a discharge of predetermined duration Δt by computing a new value $S = S - i \Delta t / C$. The value C of the battery capacity, obtained from the data provided by the manufacturer, has been stored beforehand in the memory 11. At the same time the value T, which is nil at the beginning of phase 11, is replaced by T+Δt, then the microprocessor returns to the input of phase F13.

This computing process, F13 to F17, is repeated so long as the estimated voltage E remains greater than or equal to Emin. It thus iteratively estimates, from the mathematical model described with reference to FIG. 2, discharging of the battery from its actual state of charge Sb during successive estimated time intervals Δt, taking account of the values Ro, k, Eo and C characteristic of the battery involved and of its actual power P. The sum of the estimated time intervals Δt necessary for E to become smaller than Emin corresponds to the backup time T of the battery. This time is displayed (phase F12) when the estimated voltage E has become smaller than Emin (output Y of F16).

The use of a mathematical model enabling discharging to be estimated with a very small step Δt with respect to the usual backup times enables relatively accurate values of T to be obtained, without having to enter curves characteristic of the battery in the memory. As an example, the step Δt can be comprised between 10 and 30 s.

The model used is self-adapting in so far as computation of T takes account of the actual power P delivered by the battery and, preferably, its actual state of charge Sb. In addition, its ageing can be taken into account by modifying the initial values Ro and C as will be described in greater detail further on.

Figure 5:
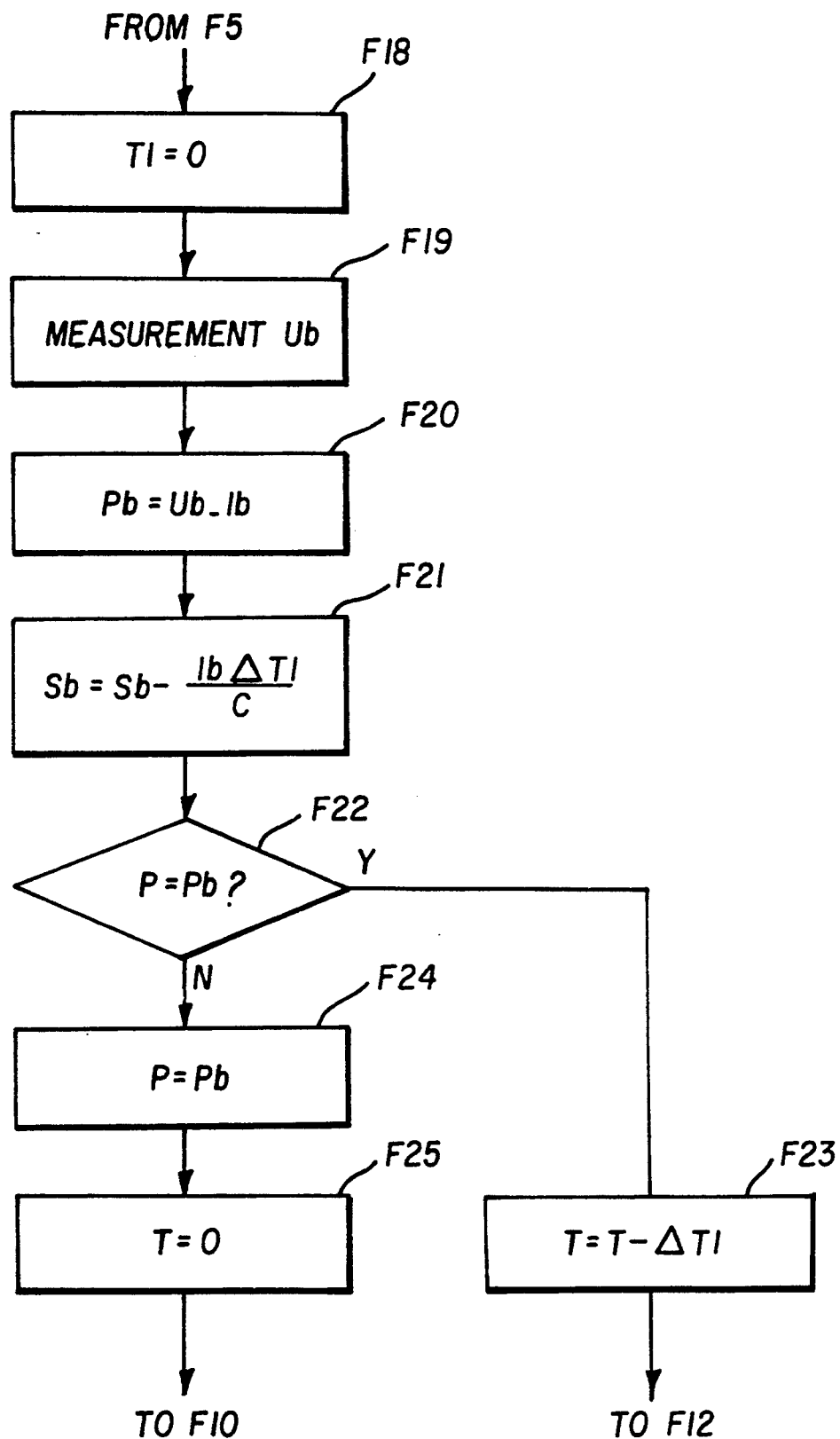
FIG. 5 represents in greater detail an embodiment of the computation phase of the power and state of charge of the battery of the flow chart of FIG. 3.

The phase F6 is represented in greater detail in FIG. 5. In a first phase F18, a quantity T1, whose meaning will be explained with reference to FIG. 6, is set to 0. Then (F19) the value of the voltage Ub at the terminals of the battery 2 is read by the microprocessor, and the power Pb=UbIb of the battery is computed (F20). The actual state of charge of the battery Sb is updated (F21) to take account of discharging of a current Ib during the time interval ΔT1:

$$Sb = Sb - Ib\Delta T1/C \tag{5}$$

If the power has remained constant since the previous backup time determining cycle, a simple updating of this time can be performed. To do this, the power P computed during the previous cycle is compared with the power Pb during a phase F22. If P=Pb (output Y of F22), the new backup time is given (F23) by:

$$T = T - \Delta T1 \tag{6}$$

then displayed (F12) as indicated by the dotted line shown in FIG. 3 connecting phase F6 to phase F12.

If, on the other hand, the power has changed (output N of F22), whether it has increased or decreased, the backup time has to be recomputed taking account of the new value of the power and of the actual state of charge Sb. In a phase F24, the microprocessor than takes as power P the power Pb, then (F25) initializes the backup time T to 0 to then enable a new computation of T (F10 and F11) by estimating a discharge.

Updating of the actual state of charge Sb in case of charging of the battery (F9) is represented in greater detail in FIG. 6. In a phase F26, the new value of Sb is computed according to the equation:

$$Sb = Sb + (Ib\Delta T1/aC) \tag{7}$$

in which a is a coefficient taking account of the efficiency of the battery. As an example, the coefficient a can vary between 1.12 for a new battery and 1.14 for a worn battery and can be chosen equal to 1.13.

The charging time T1, which is zero reset during the phase F18 of F5 as soon as discharging takes place, is updated in F27:

$$T1 = T1 + \Delta T1 \tag{8}$$

When the actual state of charge Sb reaches 1 (output Y of F28), the microprocessor resumes the determining cycle at F4. In the embodiment shown in FIG. 6, A is set to zero (F46) and Ro is computed (F31 prior to returning to F4. To avoid errors due to the measurements, the parameter Sb is reset to 1 after 12h of charging. If Sb is not equal to 1 (output N of F28) and if T1=12h (output Y of F29), during a phase F30 the microprocessor takes 1 as the value of Sb before returning to the input of F4, after the phase F31 if applicable. If not (output N of F29), the microprocessor keeps the new value of Sb computed in F26 and returns to the input of F4.

Figures 7, 8:
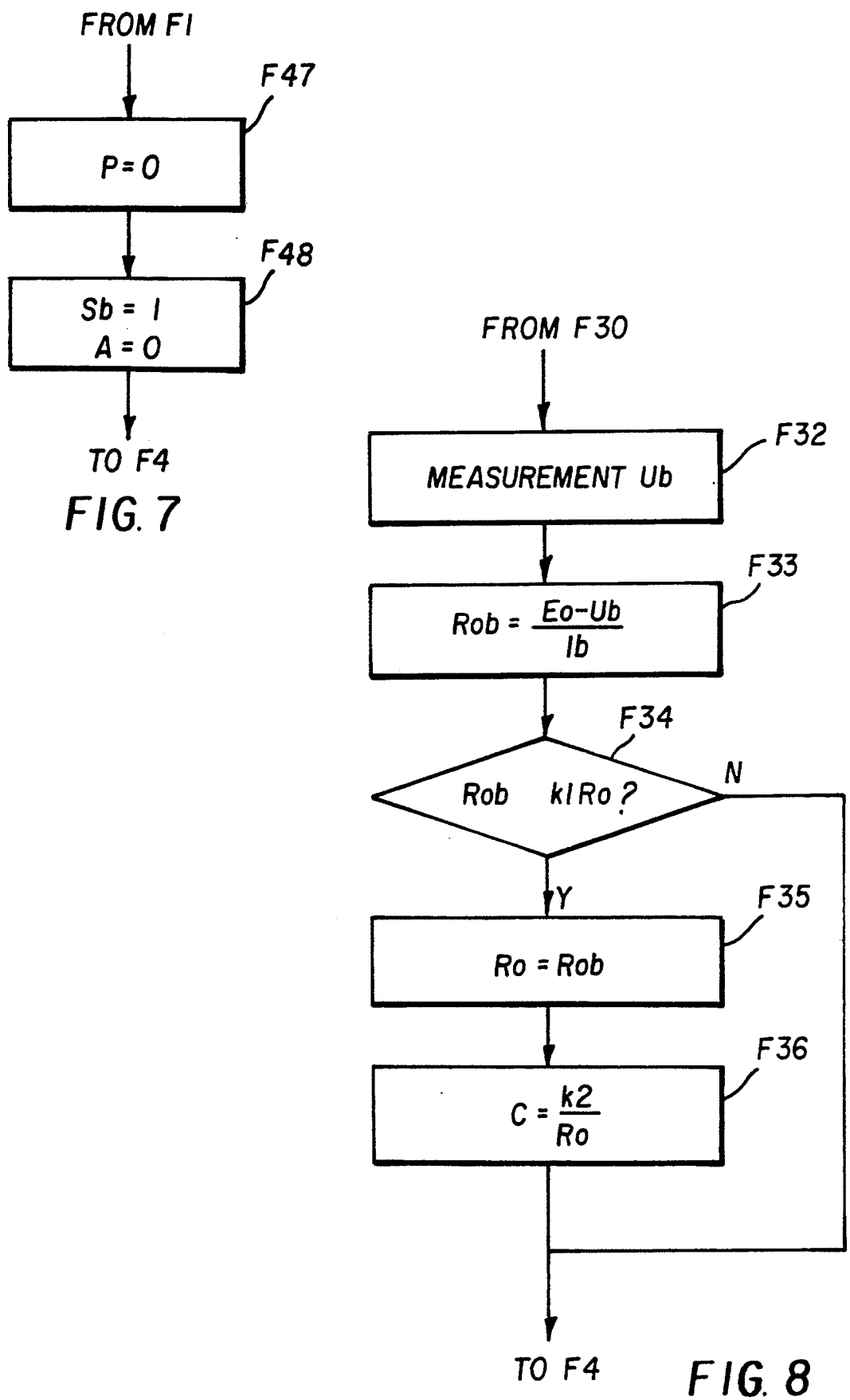
FIG. 7 illustrates in greater detail the initialization phase of the flow chart according to FIG. 3.
FIG. 8 represents an updating phase of the initial internal resistance of the battery.

During the initialization phase F3, represented in greater detail in FIG. 7, the power P is set to zero (F47) and the value of Sb to 1 (in F48).

When the battery ages, its internal resistance increases and its capacity decreases. The values of Ro and C, initially stored in the memory 11, can be updated periodically to take account of this phenomenon.

An Ro updating phase F31 can be performed when the battery is fully charged (S=1), for example after the phase F30 in FIG. 6.

When the battery is fully charged $$Ub = Eo - RoIb \tag{9}$$

We can therefore deduce a new value Rob from the measured values of Ub and Ib, according to the equation:

$$Rob = (Eo - Ub)/Ib \tag{10}$$

The Ro updating phase F31 can then comprise, as illustrated in FIG. 8, a phase F32 measuring Ub, followed by a phase F33 computing the measured value Rob of the initial internal resistance Ro according to equation (10).

If the new value Rob deviates from the previously stored value Ro by more than a preset threshold, the value Ro is replaced by the new value. Rob is therefore compared to k1Ro in a phase F34, k1 being a coefficient of preset value. As an example k1=1.05, the new value therefore being taken into account as soon as its deviation from the previous value is greater than 5%. If Rob is greater than k1Ro (output Y of F34), then Rob replaces Ro in the memory 11. Otherwise (output N of F34), Ro remains unchanged.

In a preferred embodiment, represented in FIG. 8, any modification (F35) of Ro is followed (F36) by a corresponding modification of C according to the equation:

$$C = k2/Ro \tag{11}$$

the product of Ro and C being considered as being constant, k2 being a predetermined coefficient corresponding to the initially stored product RoC.

Updating of C can also be performed when the voltage Ub at the terminals of the battery has reached its minimum voltage Emin. This updating can be performed systematically, in case of discharging, during the phase F6 of computation of P and Sb, in an additional phase inserted between phases F19 and F20 or F20 and F21 (FIG. 5).

Figure 9:
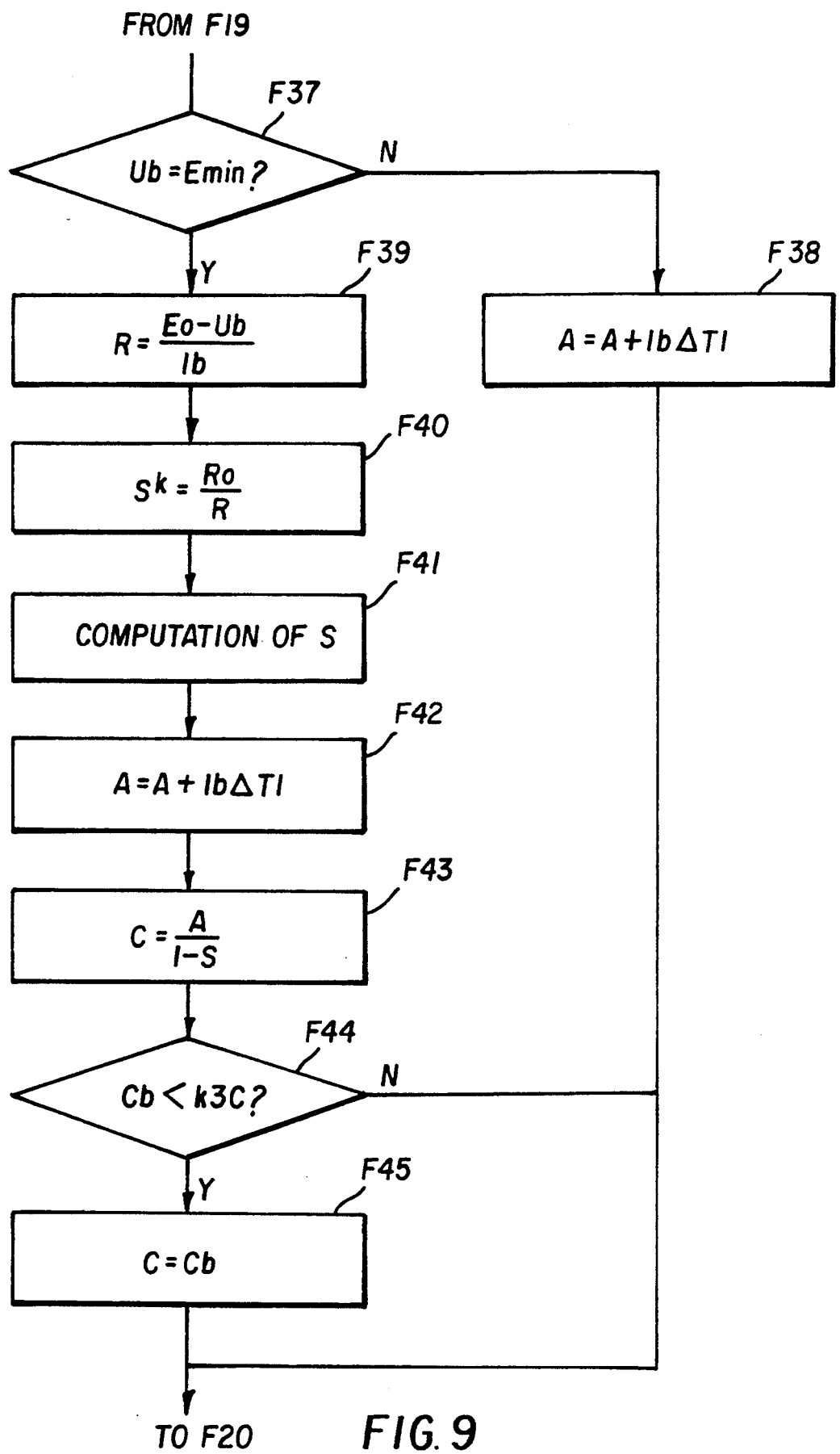
FIG. 9 illustrates a particular embodiment of an additional phase of updating of the battery capacity.

A particular embodiment of this additional updating phase is represented in greater detail in FIG. 9. The voltage Ub is first (F37) compared with Emin. If Ub is not equal to Emin (output N of F37), a quantity A, corresponding to the Ah consumed by the battery since the beginning of discharging is computed (F38) according to the equation:

$$A = A + Ib\Delta Tl \quad (12)$$

The quantity A is set to zero each time the battery is fully charged, i.e. during the phase F32 (FIG. 7) of the initialization phase and during a phase F46 following the output Y of phase F28 or phase F30 (FIG. 6) in case of recharging of the battery.

At the end of discharging (output Y of F37), the internal resistance R of the battery is computed (F39):

$$R = (Eo - Ub)/Ib \quad (13)$$

then (F40) $S^k$ is computed:

$$S^k = Ro/R \quad (14)$$

Then (F41) S is deduced from $S^k$, and the quantity A updated (F42). The new value Cb of the capacity is then computed (F43) in accordance with the equation:

$$Cb = A/(1-S) \quad (15)$$

If the new value Cb deviates from the previously stored value C by more than a preset threshold, the value C is replaced by the new value (F45). Cb is therefore compared to k3C in a phase F44, k3 being a coefficient of preset value, for example k3=0.95. If Cb is smaller than k3C (output Y of F44), then Cb replaces C in the memory 11. Otherwise (output N of F44), C remains unchanged, and the additional updating phase is terminated. Phases F38, F45 and F44 for output N are follows by phase F20 (FIG. 5), or by phase F21 if the additional updating phase is inserted between phases F20 and F21 as described above.

In the case when the battery is not called on for very long periods, it may be advantageous to update the values of Ro and C systematically. The battery does in fact age even if it is not used, its lifetime D, for example 5 years, corresponding to the time necessary for its backup time to be reduced to half its initial value. According to a preferred embodiment, the value of Ro is increased progressively whereas the capacity C is decreased progressively, the product RoC being kept constant. A linear decrease of the backup time of the battery is thus simulated over time. This updating can be ordered systematically at regular time intervals, for example once a month, for example by application of an appropriate signal to the microprocessor input 12 by the installation monitoring circuit or by any suitable supervision circuit.

To improve the accuracy even further the value of C can also be corrected from a relationship between C and the temperature supplied by the battery manufacturer. Initially the value C stored is the value corresponding to a preset temperature, for example 20° or 25° C.

Figure 10:
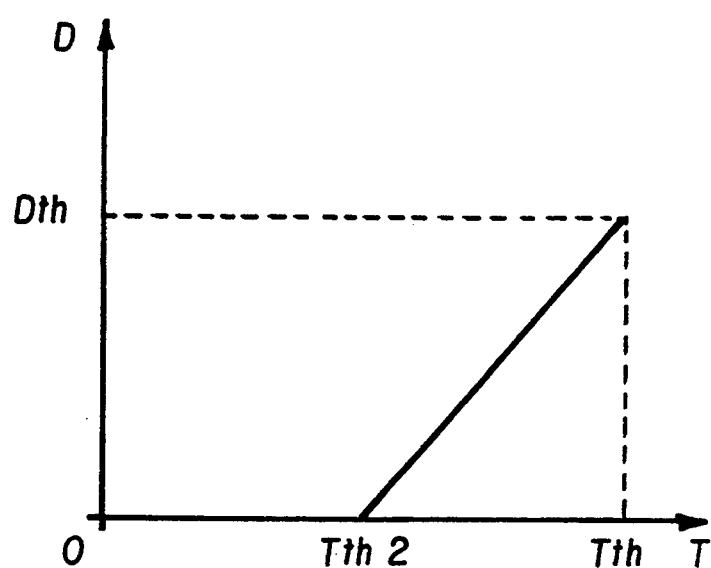
FIG. 10 illustrates the relationship between the remaining lifetime of the battery and its backup time.

Determining the backup time can be used to detect the imminence of a battery failure. The backup time of a battery is in fact normally halved at the end of its lifetime. Monitoring of the evolution of the backup time T can provide an indication on its remaining lifetime. Tth being the theoretical backup time of the battery, the battery is considered to be dead when T=Tth/2. FIG. 10 illustrates the relationship between the remaining lifetime D and the backup time T of the battery, the theoretical lifetime Dth, for example 5 years, corresponding to a backup time Tth, for example 10 mins. When T=Tth/2, the remaining lifetime is nil. By extrapolation, the remaining lifetime of the battery can be determined each time T is determined. If the curve D(T) is linear as in FIG. 10, it can be written in the form:

$$D = 2Dth \times (T/Tth) - Dth \quad (16)$$

The values Dth and Tth being previously stored in the memory 11, the microprocessor can, at each new computation of T, deduce therefrom the value of the actual lifetime D of the battery, in accordance with equation (14).

Computation of D can for example be performed automatically during an additional phase F49 after the phase F11 (FIG. 3) in which T is computed.

This additional phase F49 can also comprise a comparison phase with a preset minimum threshold, an imminent failure alarm then being triggered by the microprocessor if D is below this threshold.

We claim:

1. A process for determining the backup time of a battery comprising:
measuring a voltage at terminals of the battery,
measuring a charging or discharging current of the battery,
computing a discharge power of the battery from the measured voltage and current, and
determining a backup time of the battery in terms of the computed discharge power using an estimation process to estimate the discharging of the battery during successive estimated time intervals, said estimation process comprising the steps of, for each estimated time interval, computing an estimated voltage at the terminals of the battery taking account of the computed discharge power and of predetermined parameters characteristic of the battery, comparing the estimated voltage with a minimum discharging voltage of the battery, and summing the successive estimated time intervals, wherein the determined backup time of the battery is equal to the sum of the time intervals obtained when the estimated voltage reaches the minimum discharging voltage.

2. The process according to claim 1, comprising determination of the remaining lifetime of the battery from determination of its backup time.

3. The process according to claim 1, comprising updating of the parameters characteristic of the battery, representative of its internal resistance in the fully charged state and of its capacity, to take ageing of the battery into account.

4. The process according to claim 3, wherein updating of the internal resistance of the battery in the fully charged state comprises a predetermined progressive increase of said internal resistance.

5. The process according to claim 3, wherein updating of the capacity of the battery comprises computation of a new value of the capacity equal to the ratio between an updated value of the internal resistance of the battery in the fully charged state and a coefficient obtained by making the product of the initial values of the two parameters involved.

6. The process according to claim 1, wherein computation of the estimated voltage comprises computation of an estimated discharging current, and computation of an estimated state of charge of the battery.

7. The process according to claim 6, wherein computation of the estimated state of charge is performed at each estimated time interval by subtracting from the previous estimated state of charge the ratio between the product of the estimated current and the time interval and a parameter characteristic of the battery, representative of its capacity.

8. The process according to claim 6, comprising computation of the actual state of charge of the battery, said actual state of charge being used as the initial estimated state of charge when discharging of the battery is estimated.

9. The process according to claim 6, wherein computation of the estimated discharging current is performed in accordance with the equation $$i = (Eo - \sqrt{Eo^2 - 4RP})/2R,$$

in which Eo is an equivalent voltage characteristic of the battery, R the internal resistance of the battery and P the discharge power of the battery.

10. The process according to claim 9, wherein the internal resistance of the battery is computed during each estimated time interval, from a parameter characteristic of the battery, representative of its internal resistance when it is fully charged, and from the state of charge of the battery.

* * * * *